United States Patent [19]
Juskey et al.

[11] Patent Number: 5,336,931
[45] Date of Patent: Aug. 9, 1994

[54] ANCHORING METHOD FOR FLOW FORMED INTEGRATED CIRCUIT COVERS

[75] Inventors: Frank J. Juskey, Coral Springs; Douglas W. Hendricks, Boca Raton, both of Fla.

[73] Assignee: Motorola, Inc., Schaumburg, Ill.

[21] Appl. No.: 115,971

[22] Filed: Sep. 3, 1993

[51] Int. Cl.[5] ................... H01L 23/28; H01L 23/29
[52] U.S. Cl. ................................ 257/787; 437/211; 174/52.2
[58] Field of Search ............... 257/787, 788, 790, 791; 437/211, 214; 174/52.2, 52.3

[56] References Cited

U.S. PATENT DOCUMENTS 5,136,366  8/1992  Worp ........................... 357/72

FOREIGN PATENT DOCUMENTS 52-53665  4/1977  Japan ........................... 257/787
55-11361  1/1980  Japan ........................... 257/787
58-103143  6/1983  Japan ........................... 257/787

Primary Examiner—Jerome Jackson
Assistant Examiner—Donald L. Monin, Jr.
Attorney, Agent, or Firm—Thomas Berry; Phillip Macnak

[57] ABSTRACT

A flow formed encapsulated integrated circuit package (100) includes a printed circuit substrate (160) having upper and lower opposed surfaces and one or more anchor holes (150). The one or more anchor holes (150) have an upper aperture in the upper surface and a lower aperture in the lower surface. One or more integrated circuit die (130) are electrically and mechanically attached to the upper surface of the substrate (160). In addition, a solder resist mask (190) is attached to the lower surface of the substrate which covers the aperture of the one or more anchor holes (150). Flow formed material (110) is formed around the integrated circuit die (130) so as to encapsulate the one or more integrated circuits (150), the flow formed material (110) covering at a least a portion of the upper surface of the printed circuit substrate (160) and extending substantially into the anchor hole (150).

12 Claims, 3 Drawing Sheets

ANCHORING METHOD FOR FLOW FORMED INTEGRATED CIRCUIT COVERS

FIELD OF THE INVENTION

This invention relates in general to integrated circuit packaging and in particular to flow formed integrated circuit covers.

BACKGROUND OF THE INVENTION

The encapsulating of electronic devices which include integrated circuit die, mounted on the surface of a substrate and wire bonded to achieve electrical interconnection to the substrate, can be accomplished by transfer molding or flow forming.

Transfer molding involves the use of a thermoset plastic, typically novolac modified epoxy resins, injected at high temperatures and under high pressures into a metal die cavity covering the top of the substrate to which is attached one or more bonded die, typically in an array that is later separated into individual devices. In this process a backing plate for the die covers the bottom of the substrate to prevent the material from being pressed out the bottom through the many plated through holes that typically exist in the substrate for electrical interconnection between the top and bottom of the substrate.

Flow forming, also known to one of ordinary skill in the art as glob top packaging, involves the use of a different thermoset plastic, such as epichlorhydrin Bisphenol-A epoxy, which is formed at lower temperatures, and relies upon a low viscosity of the material at the forming temperature, a dam around the periphery of the substrate to constrain the lateral flow, and gravity to form the protective cover for the device. Flow forming has advantages over transfer molding including the ability to typically handle larger arrays, and simpler processing machinery, making it a lower cost process. In flow forming, the adhesion of the cover to the substrate has relied on adhesive properties that occur between the flow material, typically an epoxy encapsulating material, and the surface of the substrate, typically ceramic or glass epoxies or mask or film surfaces on the surface of the substrate. The flow forming method has been used successfully in the past because the area of the attachment surface is large compared to the total covered area and the substrate is substantially inflexible within the covered area. Because products are growing smaller to meet market demands and integrated circuit die are growing larger with more and more outputs, the surface area covered by the flow formed material compared to the total substrate area is becoming smaller. Furthermore, the need to make complex devices more economically is leading to a choice of inherently less expensive, more flexible substrate materials such as glass epoxy instead of ceramic.

Under these circumstances, the reliability of the attachment of the flow formed cover to the substrate can become unacceptable, with the top loosening from the substrate, or from the film on the substrate, during electrical testing, as in that done with a spring pin test fixture having many pins, or under the stresses of punching an integrated circuit device encapsulated by a flow formed cover out of an array of such devices.

A similar problem exists in devices encapsulated by transfer molding. An improvement usable with transfer molding is taught in U.S. Pat. No. 5,136,399, issued on Aug. 4, 1992 to Worp et al. In this technology, the shape of the bottom end of the cover's attachment anchor pin is determined by the bottom mold cavity, or plate. This invention has shown merit for devices fabricated using transfer molding techniques but would complicate and increase the cost of flow formed molding by requiring a similar mold under the substrate during the cover forming process. Thus, what is needed is a means to improve the attachment of the flow formed cover to the substrate in a flow forming process.

SUMMARY OF THE INVENTION

Accordingly, in the preferred embodiment of the present invention, a flow formed encapsulated integrated circuit package comprises a printed circuit substrate having upper and lower opposed surfaces and one or more anchor holes, said one or more anchor holes comprising an upper aperture in the upper surface and a lower aperture in the lower surface; one or more integrated circuit die electrically and mechanically attached to the upper surface of the substrate; a solder resist mask attached to the lower surface of said substrate which covers the lower aperture of the one or more anchor holes; and flow formed material formed around the integrated circuit die so as to encapsulate the one or more integrated circuits, said flow formed material covering at least a portion of the upper surface of the printed circuit substrate and extending, substantially into the anchor hole.

DETAILED DESCRIPTION OF THE INVENTION

Figure 1:
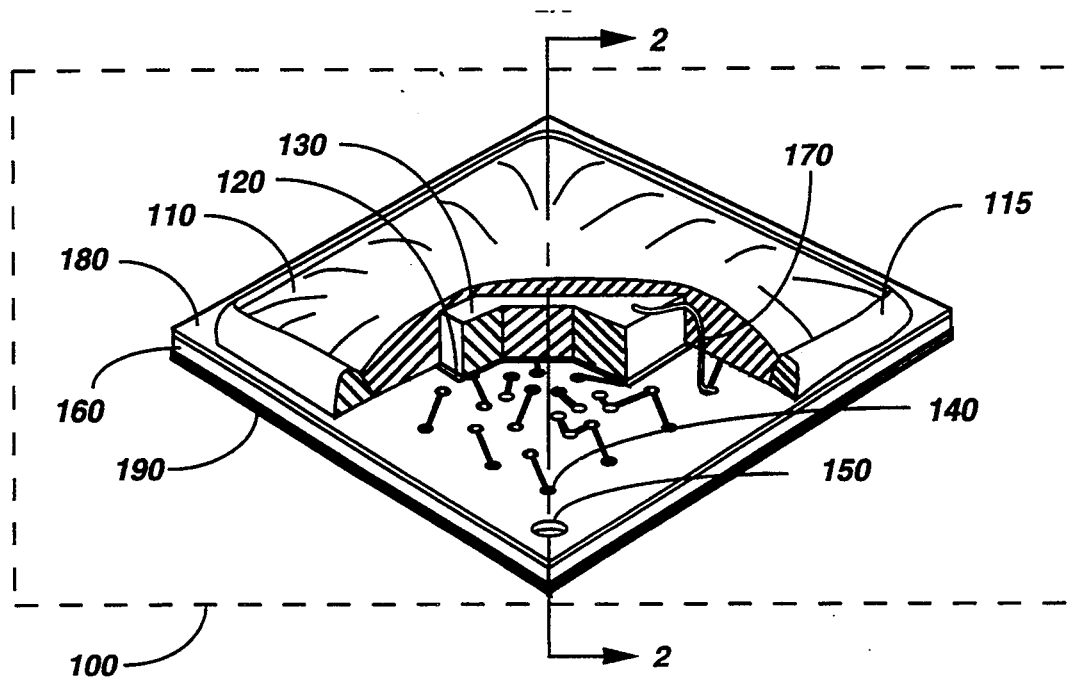
FIG. 1 is a mechanical diagram showing a three dimensional cutaway view of an encapsulated integrated circuit in accordance with the preferred embodiment of the present invention.

Referring to FIG. 1, a three dimensional cut-away view of a rectangular encapsulated integrated circuit 100 is shown in accordance with the preferred embodiment of the present invention. The encapsulated circuit 100 comprises a substrate 160 further comprising an anchor hole 150 (one shown) and a circuit connection hole 140, an upper solder mask 180, a lower solder mask 190, a die attachment adhesive 120, an integrated circuit die 130, wire bonds 170 (only one shown), a flow forming dam 115, and a flow formed cover 110, also known in the art as a glob top.

The integrated circuit die 130 is attached through the upper solder mask 180 to the upper surface of the substrate 160 by the die attachment adhesive, such as a Hitachi EN-4072 adhesive manufactured by Hitachi Chemical Co. Ltd., of Tokyo, Japan in the preferred embodiment of the present invention.

The input and output signals of the die 130 are coupled to the substrate 160 by a plurality of wire bonds, of which one wire bond 170 is visible in FIG. 1, in a manner well known in the art. Various other means of mechanical and electrical attachment of the die to the substrate 160 may also be used, such as tape automated bonding, flip chip bonding, or other methods well known in the art. The circuit connection hole 140 is one of a plurality of similar plated through holes, well known in the art, which couple signals between conductive conductors on the surfaces of the substrate 160 by means of conductive plating that is deposited on the surface of the substrate 160, which is typically cylindrical or barrel shaped, which surrounds and forms the plated through hole and which is attached to the conductive conductors on the surfaces of the substrate 160.

The anchor hole 150 is located in the substrate 160 at a location that experiences high stress between the flow formed cover 110 and the substrate 160 when the substrate 160 is flexed such as at the corners. The substrate 160 in the preferred embodiment of the present invention is a printed circuit board, 0.028 inch thick, manufactured using a material such as number CCl-HL832 Bismaleimide Triazine-Epoxy laminate made by Mitsubishi Gas and Chemical Co. Inc., of Tokyo, Japan. Inside the periphery of the substrate 160 is the dam which defines the horizontal periphery of the flowed top. The dam material in the preferred embodiment of the present invention is Dam Material CNB-648-41 manufactured by Dexter Hysol Inc., of Olean, N.Y. In the present invention, a total of four identical anchor holes 150 (of which one is visible in FIG. 1) are located at high stress locations near the corners of the encapsulated circuit 100. The high stress occurs under conditions of flexing of the substrate 160, which is typically caused during such operations as the punching out of the integrated circuit from an array of integrated circuits which undergoes the packaging process. The locations of the stress points are determined using a mechanical analyzer such as an Instron Mechanical Analyzer, made by Instron Inc., of Canton, Mass., or a similar device.

In the preferred embodiment of the present invention, the diameter of the anchor hole 150 is substantially equivalent to the thickness of the substrate 160, thereby allowing the cover forming material to flow into and more completely fill the anchor hole 150. Also, in the preferred embodiment of the present invention, the surface of the substrate 160 forming and surrounding the anchor hole 150 , typically barrel or cylindrical shaped, is preferably not plated, providing what is known as an unplated hole to one skilled in the art . This allows the cover material to achieve a better attachment than that achieved by just the surface adhesion of the formed cover 110 to the substrate 160 and upper solder mask 180. The preferred material for the flow formed cover is Encapsulant 4450 manufactured by Hysol of Olean, N.Y. The upper solder mask 180 covers the upper surface of the substrate 160 except at locations where solder or wire bond connections are to be made to circuit connections. The lower solder mask 190 covers the lower surface of the substrate 160 except at locations where solder connections are to be made to circuit connections. In the preferred embodiment of the present invention the upper and lower solder masks 180 and 190 are of the dry film type, Solder Mask SR-4000 manufactured by Hitachi of Tokyo, Japan. It should be appreciated that in the preferred embodiment of the present invention, the upper solder mask 180 does not cover the anchor hole 150, whereas the lower solder mask 190 does cover the anchor hole 150, and the barrel surface of the substrate 160 surrounding the anchor hole 150 is not conductive plated. The lower solder mask 190 thereby acts as a bottom to the anchor hole 150 to prevent the cover forming material from flowing out through the bottom of the anchor hole 150 during the flow forming of the cover 110. The use of an unplated hole increases the attachment strength of the cover 110 to the substrate 160. The use of the dry film type of solder mask provides a barrier across the bottom of the anchor hole 150 of sufficient strength that separate means such as a backing plate (as used for transfer molding) or an additional mask specific to the anchor holes, are not needed. This is a unique and economical means for providing the necessary barrier.

Figure 2:
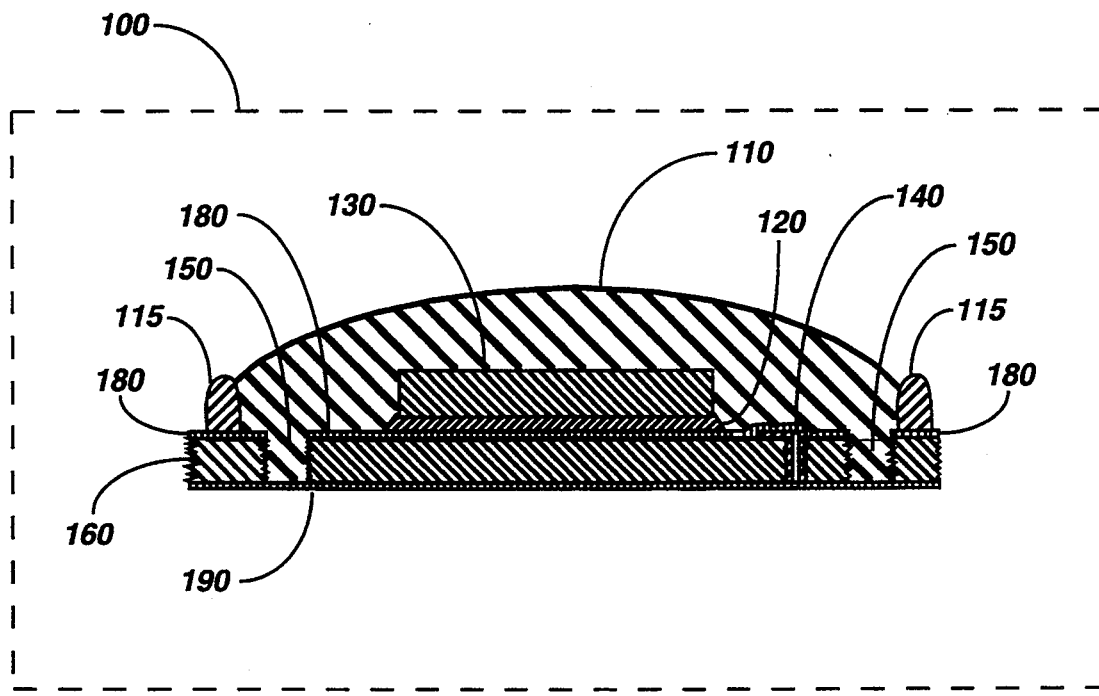
FIG. 2 is a mechanical diagram showing a two dimensional cross section of an encapsulated integrated circuit in accordance with the preferred embodiment of the present invention.

Shown in FIG. 2 is a two dimensional cross sectional view of the encapsulated integrated circuit shown in FIG. 1, in accordance with the preferred embodiment of the present invention. The elements shown in FIG. 1 are also shown in FIG. 2, with the following exceptions: two anchor holes 150 are visible in FIG. 2 and no wire bond 170 is visible in FIG. 2. Three segments of the upper solder mask 180 appear in the FIG. 2 cross section, as well as two segments of the dam 115. The cross section shows the anchor holes 150 filled with the flowed cover material, and the plated through circuit hole 140, into which the flowed cover material does not flow.

It should be appreciated that a variety of interconnection methods for connecting the encapsulated integrated circuit to external devices exist, such as pad grid arrays, edge mounted pins, and edge mounted solder leads. It should also be appreciated that the improvement over the prior art enabled by the use of the anchor holes 150 which are sealed on the bottom by the lower solder mask 190 will also occur when other flow formed cover materials or other substrate materials are used. It should be further appreciated that there are circumstances where one or more of the plated through circuit holes 140 can be used effectively as one or more anchor holes 150 as well as circuit connectors 140, requiring that the upper solder mask 180 does not cover the upper aperture of the one or more circuit holes 140 and that the lower solder mask 190 does cover the lower aperture of the one or more circuit holes 140 which are also anchor holes 150. For example, the use of one or more circuit holes 140 as anchor holes 150 would be more effective when the typical circuit hole 140 had a diameter substantially equal to the thickness of the substrate 160, and area on the substrate 160 for separate anchor holes 150 was not available.

Figure 3:
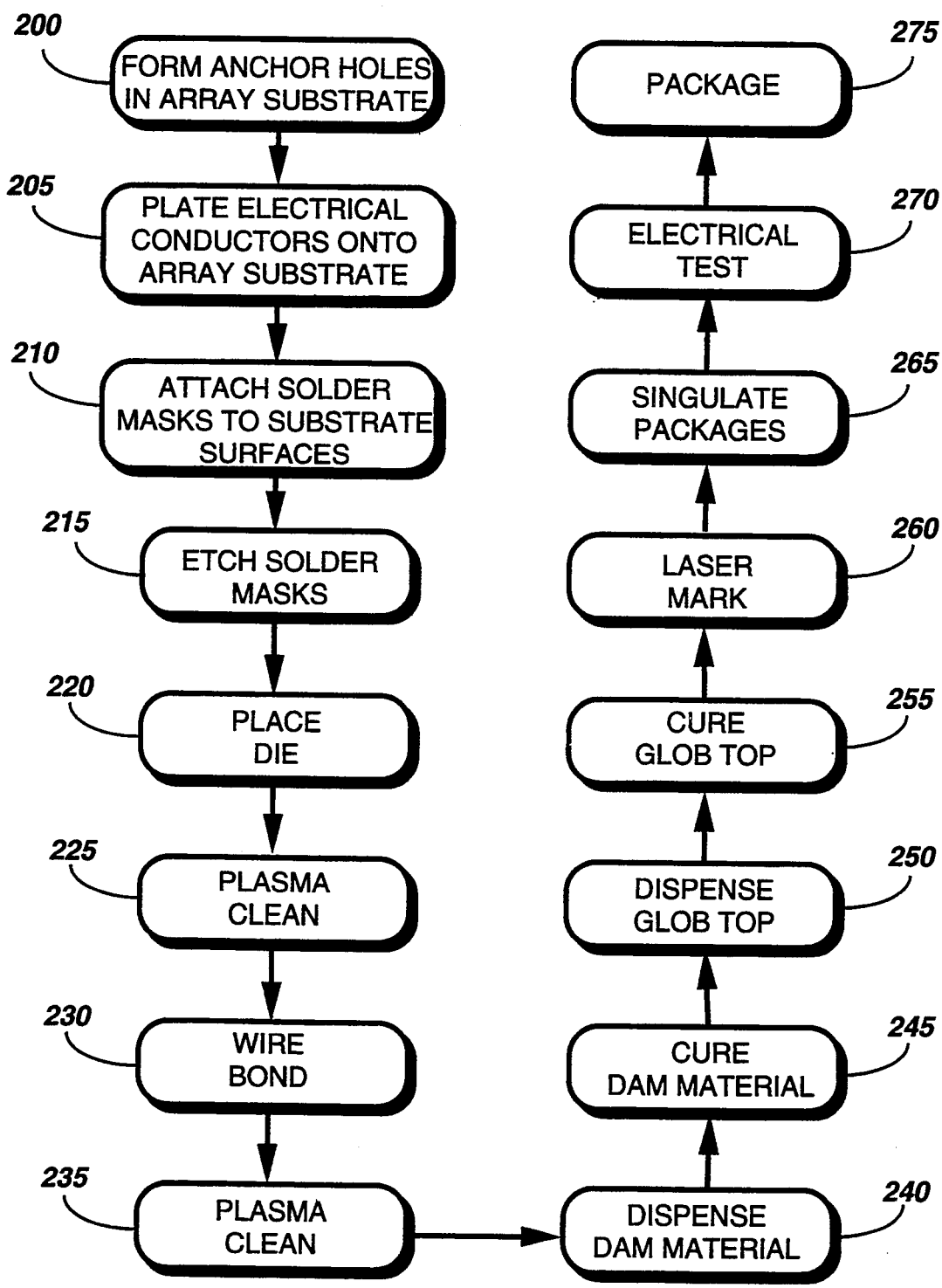
FIG. 3 is a flow chart of a method used to fabricate an integrated circuit in accordance with the preferred embodiment of the present invention.

Referring to FIG. 3, a flow chart of the process steps used to fabricate an integrated circuit 100 in accordance with the preferred embodiment of the present invention is shown. The process begins in step 200 when the substrate 160 for an array of integrated circuit devices 100 is drilled to create the anchor holes 150. In step 205 the metal plating pattern for the signal conducting and connecting is added to the substrate 160, with precaution taken to avoid plating the substrate surface surrounding the anchor holes 150. In step 210 the upper solder mask 180 and the lower solder mask 190 are attached to the surfaces of the substrate 160 over the metal plating pattern. In step 215, the solder mask is selectively removed to expose portions of the metal plating pattern that are to be used as connections, such as to wire bonds 170, test pins, or solder pads. It should be appreciated that in this step the solder mask material at the top end of the anchor holes 150 is removed, but the material over the bottom ends is not removed. The die is then attached to the substrate 160 in step 220. The substrate 160 with assembled parts is plasma cleaned in step 225, following which the wire bonds are attached to the die connect points and substrate connect points, in step 230 using such well known bonding methods as either aluminum wire and thermocompression bonding or gold wire and ball bonding. Next, the substrate assembly undergoes another plasma cleaning, in the preferred embodiment of this process, in step 235. The flowed cover dam material 115 is then dispensed around the inside of the periphery of each integrated circuit portion of the substrate 160 on the array, in step 240, and the periphery dam material is cured in step 245. Sufficient flow formed cover material to form an encapsulating cover, or glob top, without overflowing the peripheral dam is dispensed as a liquid into each dammed integrated circuit area of the array in step 250. In step 255 the liquid flow formed cover material flows into the anchor holes 150 and fills out to the peripheries formed by the periphery dam 115 by the force of gravity, and is cured into a solid at 180 degrees Centigrade. The encapsulated integrated circuits are laser marked in step 260, although it will be appreciated. In step 265, the encapsulated circuits are sheared from the array and then electrically tested in step 270. Finally, the good encapsulated circuits are packaged for handling and shipping in step 275.

Figure 4:
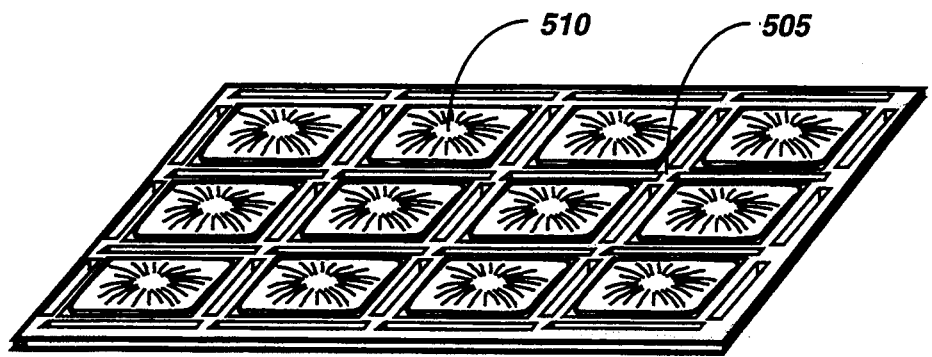
FIG. 4 is a drawing of an array of encapsulated integrated circuit devices in accordance with the preferred embodiment of the present invention.

Referring to FIG. 4, an array of integrated circuits is shown in accordance with the preferred embodiment of the preferred invention. The array of twelve packaged circuits 510 is shown as they appear after step 260 of FIG. 3, when the packaged circuits 510 are ready to be punched out from the array by a steel rule die process familiar to one skilled in the art. The packaged circuits 510 are separated by webs 505 of the substrate material. It is during this punching out process that one form of stress occurs, as previously mentioned, which can lead to the unreliable attachment of the cover to the substrate.

Figure 5:
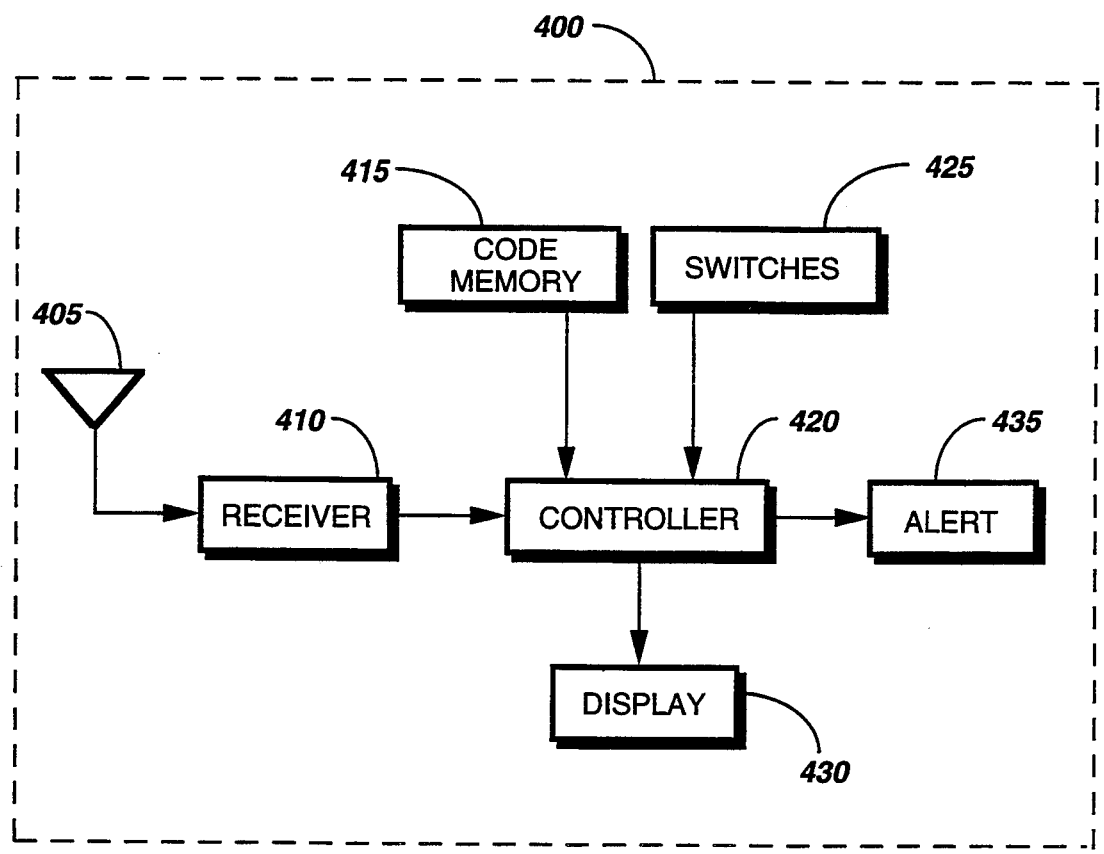
FIG. 5 is an electrical block diagram of a paging selective call receiver in accordance with the preferred embodiment of the present invention.

Referring to FIG. 5, an electrical block diagram of a paging selective call receiver (pager) 400 is shown, in accordance with the preferred embodiment of the present invention. The pager 400 comprises an antenna 405 for receiving a radio signal, which is coupled to a receiver 410. An output of the receiver 410 is coupled to an input of a controller 420. The controller 420, which comprises a microprocessor with both program and temporary memory, is coupled to a code memory 415 which stores a selective address for the pager 400, switches 425 for controlling the power mode and other states of the pager 400, a display 430 for displaying received messages and operational information, and an alert device 435 for indicating a receipt of a valid message. The receiver 410 converts and generates a demodulated signal which is coupled to the controller 420. The microprocessor in the controller 420, operating by instructions in the program memory, compares information received in a portion of the demodulated signal to the address of the pager 400 stored in the code memory 415. When the information in the received signal compares to the address of the pager 400, an alert indication is produced by the alert circuit 435. The alert device is typically of the type which produces an audible tone and/or mechanical vibration, depending on the operation and setting of the switches 425. The information in the remaining portion of the signal is shown on the display 430 and may also be stored in the temporary memory in the controller 420, for later display, depending on the operation and settings of the switches 425. It should be appreciated that the selective call receiver could be of the type which also transmits messages by means of radio signals. The present invention is typically used in one or more of the following circuits of the pager 400: the receiver 410, the controller 420, the display 430, and the code memory 415.

The unique addition of the anchor holes 150 covered by the bottom solder mask 190 provides a means of significantly improving the attachment of the flowed material cover to the substrate over the prior art, with no additional process steps required. In addition to improving the anchoring of the covers to the substrates for individual electronic devices being processed singularly or in an array, the present invention can be used for flow formed covers in the packaging technique called chip on board, wherein a number of integrated circuit die, not necessarily providing the same functions, are individually encapsulated on a printed circuit (PC) board which also interconnects the die to each other and interconnects the die to support circuitry on the same PC board. The use of the present invention will improve the cover attachment for the chip on board technique and provides a significant advantage for this technique because transfer molding is less practical than flow forming for encapsulating chip on board assemblies.

We claim:

1. A flow formed encapsulated integrated circuit package comprising:
    a printed circuit substrate having a predetermined thickness, upper and lower opposed surfaces, and one or more anchor holes, said one or more anchor holes comprising an upper aperture in the upper surface and a lower aperture in the lower surface, the anchor hole apertures having predetermined diameters, wherein the predetermined diameters of the upper and lower apertures of the one or more anchor holes are substantially equivalent to the predetermined thickness of the substrate;
    one or more integrated circuit die electrically and mechanically attached to the upper surface of the substrate;
    a solder mask attached to at least the lower surface of said substrate which covers the lower aperture of the one or more anchor holes; and
    flow form material formed around the integrated circuit die so as to encapsulate the one or more integrated circuits, said flow form material covering at a least a portion of the upper surface of the printed circuit substrate and extending substantially into the one or more anchor holes.

2. The flow formed encapsulated integrated circuit package according to claim 1, wherein said substrate has a pad grid array interconnection pattern.

3. The integrated circuit package according to claim 1 wherein the solder mask is a dry film solder mask.

4. The integrated circuit package according to claim 1 wherein the substrate surrounding the one or more anchor holes has a barrel surface, and the barrel surface is not conductively plated.

5. The integrated circuit package according to claim 1 wherein the substrate surrounding the one or more anchor holes has a barrel surface, and the barrel surface is conductively plated.

6. The integrated circuit package according to claim 1 wherein the package comprises an array of integrated circuits.

7. A flow formed encapsulated integrated circuit package comprising:
   a printed circuit substrate having upper and lower opposed surfaces and one or more anchor holes; said one or more anchor holes comprising an upper aperture in the upper surface and a lower aperture in the lower surface;
   an integrated circuit die electrically and mechanically attached to the upper surface of the substrate;
   a dry film solder mask attached at least to the lower surface of said substrate which covers the lower aperture of the one or more anchor holes; and
   flow formed material formed around the integrated circuit so as to encapsulate the integrated circuit, said flow formed material covering at a least a portion of the upper surface of the printed circuit substrate and extending substantially into the substrate hole.

8. The integrated circuit package according to claim 7 wherein the substrate has a predetermined thickness and the anchor hole apertures have a predetermined diameter, wherein the predetermined diameters of the upper and lower apertures of the one or more anchor holes are substantially equivalent to the predetermined thickness of the substrate.

9. The flow formed encapsulated integrated circuit package according to claim 7, wherein said substrate has a pad grid array interconnection pattern.

10. The integrated circuit package according to claim 7 wherein the substrate surrounding the one or more anchor holes has a barrel surface, and the barrel surface is not conductively plated.

11. The integrated circuit package according to claim 7 wherein the substrate surrounding the one or more anchor holes has a barrel surface, and the barrel surface is conductively plated.

12. A selective call radio receiving device, for receiving a selective call signal including an address, the selective call radio receiving device comprising:
   a receiver for converting and demodulating the selective call signal, including the address;
   a controller, coupled to the receiver, for comparing the demodulated address with a predetermined address assigned to the selective call radio receiving device; and
   an alert device, coupled to and responsive to said controller, for producing an alert indication when the demodulated address is the same as the predetermined address of the selective call device; and
   wherein at least a portion of said receiver and said controller comprises:
   a flow formed encapsulated integrated circuit package for providing at least a portion of the functions of converting and demodulating the received signal, and comparing the demodulated address, the flow formed encapsulated integrated circuit package comprising:
      a printed circuit substrate having upper and lower opposed surfaces and one or more anchor holes; said one or more anchor holes comprising an upper aperture in the upper surface and a lower aperture in the lower surface, the lower surface including an array of solderable pads;
      an integrated circuit die electrically and mechanically attached to the upper surface of the substrate;
      a dry film solder mask attached at least to the lower surface of said substrate which covers the lower aperture of the one or more anchor holes; and
      flow formed material formed around the integrated circuit so as to encapsulate the integrated circuit, said flow formed material covering at a least a portion of the upper surface of the printed circuit substrate and extending substantially into the substrate hole.

* * * * *